United States Patent [19]

Hikida et al.

[11] 4,215,290

[45] Jul. 29, 1980

[54] THICK-FILM CIRCUIT DEVICE

[75] Inventors: Chuichi Hikida; Takao Kishino; Tadashi Mizohata; Tatsuo Yamaura, all of Mobara, Japan

[73] Assignee: Futaba Denshi Kogyo K.K., Chiba, Japan

[21] Appl. No.: 958,392

[22] Filed: Nov. 7, 1978

[30] Foreign Application Priority Data

Nov. 10, 1977 [JP] Japan .................................. 52-134077
Jun. 16, 1978 [JP] Japan .................................. 53-72240

[51] Int. Cl.² .......................... H01J 5/10; H01J 5/52; H01J 63/02
[52] U.S. Cl. .................................... 313/496; 313/220; 313/221
[58] Field of Search ............... 313/496, 497, 220, 221, 313/489, 217

[56] References Cited

U.S. PATENT DOCUMENTS

| 4,023,876 | 5/1977 | Fukunaga et al. ............... 313/217 X |
| 4,100,456 | 7/1978 | Kobayakawa et al. ............... 313/497 |

OTHER PUBLICATIONS

"Flat—Package Indicator Tubes", by K. Donuma et al, *Toshiba Review*, No. 108, Mar.-Apr. 1977, pp. 21-24.

*Primary Examiner*—Palmer C. Demeo
*Attorney, Agent, or Firm*—Oblon, Fisher, Spivak, McClelland & Maier

[57] ABSTRACT

A thick-film circuit device having a substrate of insulating material containing alkali components, a first crossover made of non-alkali type glass and formed on the substrate, wiring conductors formed on the first crossover according to a predetermined circuit pattern, and a second crossover made of glass and formed on the first crossover so that it covers the wiring conductors, the first crossover preventing entry of sodium ions into the second crossover.

6 Claims, 4 Drawing Figures

THICK-FILM CIRCUIT DEVICE

BACKGROUND OF THE INVENTION

1. Field of the Invention

The present invention relates to a thick-film integrated circuit device having a substrate formed from an insulating material, as sheet glass, containing alkali-metal compounds, and circuit patterns formed on the substrate.

2. Description of the Prior Art

In the thick-film circuit device, conductive materials are printed and fired on the substrate of insulating material by the screen printing method to form wiring conductors thereon. In addition, in order to increase the packaging density of circuits as necessary, an insulating layer (hereinafter referred to as a crossover) for interlayer insulation is printed and fired on the above-mentioned wiring conductors so as to make multilayer interconnection possible. Thus, electric circuits are formed on a single sheet of substrate.

In the thick-film circuit device, as mentioned above, electronic circuits can be formed by repeating such processes as printing and firing. In this manner, the production process can be simplified and the device in which the electronic circuits are incorporated can be miniaturized because the packaging density of the circuits can be made high. Thus, the thick film production process have become widely used for producing electronic circuits of various devices.

For instance, in the case of fluorescent display tubes in which thermions emitted from the filamentary cathode heated are made to impinge on phosphor-coated anodes thereby to visually display numerals, characters, graphic forms and the like, those of the flat type or the multi-digit type have become easy to produce by the introduction of the thick-film circuit technique.

FIG. 1 shows a perspective view of the substrate and its vicinity of the fluorescent display tube by way of example, and FIG. 2 is an enlarged sectional view thereof. Reference numeral 1 designates a substrate of insulating material. On this substrate 1, wiring conductors 2 are printed and fired according to a desired pattern by the screen printing method. In addition, a crossover 3 having through-holes for the wiring conductors 2 are printed and fired on the substrate 3 at predetermined positions. Furthermore, phosphor-coated anodes 4 are formed on the crossover 3 so that they are electrically connected to the corresponding wiring conductors 2 through the above-mentioned through-holes. External terminals 5 are connected to the ends of the respective wiring conductors 2 so that drive signals are given externally. With the above-mentioned construction, the fluorescent display tube can be easily made to be flat or of the multi-digit type by the introduction of the thick-film circuit technique.

Meanwhile, the substrate for use in the thick-film circuit is heretofore usually made of the so-called porcelain type ceramics such as alumina porcelain. However, such ceramics are inherently very expensive. Therefore, these ceramics have been replaced by sheet glass much more inexpensive than the ceramics.

Recently, the thick-film circuit devices are incorporated in various electronic apparatuses, being used under various environments. Under these circumstances, it has been found that after used for a long time at an elevated temperature the above-mentioned glass substrate tends to undergo deterioration in the insulation between the wiring conductors.

The inventors of the present invention have studied on the cause of the above-mentioned deterioration of insulation, and as a result have come to the following conclusion:

As mentioned above, the substrate for use in the thick-film circuit device is usually made of sheet glass, because it is inexpensive and easy to form. This sheet glass is soda-lime glass containing $SiO_2$ and $Na_2O$ as its main alkali component. Meanwhile, the crossover for interlayer insulation must have a firing temperature lower than the softening temperature of the sheet glass used as the substrate, and in addition must have a coefficient of thermal expansion similar to that of the substrate of sheet glass. For this reason, the crossover is usually made of insulating material consisting of lead-borate type glass mainly containing PbO. Thus, the crossover is formed on the substrate by printing and firing the above-mentioned insulating material thereon.

More detailed description will be made on this point with reference to FIG. 2. Sodium ions $Na^+$ freed from the net-like bonding structure of the sheet glass are dispersed toward the crossover 3 under the influence of high temperatures during the firing process through the interface between the substrate 1 and the crossover 3 and between the wiring conductors 2.

In this state where such sodium ions $Na^+$ are present, if a potential difference is given between the wiring conductors 2, the above-mentioned sodium ions $Na^+$ move toward the wiring conductors 2 negative in potential, where they discharge to form sodium Na. Since sodium Na thus produced is active, it reduces PbO present in the crossover 3 to deposit lead (Pb) according to the following reaction:

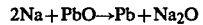

$$2Na + PbO \rightarrow Pb + Na_2O$$

The lead Pb thus produced grows dendritically on the wiring conductors 2 negative in potential as shown in a circle designated by character A in FIG. 3, and thereby reduces the insulation resistance between the wiring conductors 2 or causes insulation deterioration therebetween.

The movement of the above-mentioned sodium ions $Na^+$ becomes more active as the temperature increases. Therefore, if the thick-film circuit device of this type is kept at a high temperature for a long time while being energized, it undergoes deterioration of insulation and decrease in life.

In addition, in the above-mentioned fluorescent display tube, the above-mentioned substrate on which various electrodes are formed are sealed in a vacuum package so as to keep the electrodes in a high vacuum. In the case of a flat-type fluorescent display tube, for instance, a front bulb made of glass or the like is airtightly bonded to the substrate along the periphery thereof to form a vacuum package. In this case, external terminals through which drive signals are externally given to the respective electrodes are airtightly penetrated through the sealing section between the front bulb and the substrate. The sealing section is bonded together using a sealing agent, as frit glass, containing PbO. If a potential difference is given between the external terminals at high temperatures, sodium ions $Na^+$ dispersed from the substrate or the front bulb to the sealing section are converted into metallic sodium Na. Thus, the metallic sodium Na reduces PbO to deposit metallic lead Pb and thereby deteriorates insulation between the external terminals.

SUMMARY OF THE INVENTION

The present invention is intended to eliminate the above-mentioned disadvantages of the prior art.

It is an object of the present invention to provide a thick-film circuit device which can eliminates deterioration of insulation between wiring conductors even if kept at a high temperature for a long time and therefore can prolong its service life and which can at all times perform stable and normal circuit operations.

It is another object of the present invention to provide a thick-film circuit device which can use sheet glass inexpensive, easily available and easy to form as the substrate, and therefore can produce great effects in terms of production and also cost reduction.

According to one aspect of the present invention, there is provided a thick-film circuit device comprising a substrate made of insulating material containing alkali metal compounds, such as sheet glass consisting of soda-lime glass and so on, a first crossover made of non-alkali type glass and provided on the substrate, wiring conductors formed on the first crossover according to a predetermined circuit pattern, a second crossover made of lead-borate type glass and provided on the first crossover so that it covers the wiring conductors, the first crossover preventing entry of sodium ions Na+ into the second crossover and also preventing movement of alkali metal ions dispersed from the substrate thereby eliminating deposition of lead on the wiring conductors due to electrolysis.

According to another aspect of the present invention, there is provided a thick-film circuit device which comprises a substrate made of insulating material containing alkali compounds, such as sheet glass consisting of soda-lime glass and so on, a front bulb made of the same insulating material as the substrate, the front bulb being airtightly bonded to the substrate along its periphery by using a sealing cement to form a package, a first crossover made of non-alkali type glass and provided on the substrate in the package, wiring conductors and their external terminals formed on the first crossover according to a predetermined circuit pattern, an insulating layer made of the same material as the first crossover and provided under the bonding section of the front bulb, a second crossover made of lead-borate type glass and provided on the first crossover so that it covers the wiring conductors and their external terminals, the first crossover and the insulating layer under the front bulb preventing entry of sodium ions Na+ into the second crossover and the sealing cement and also preventing movement of alkali metal ions dispersed from the substrate and the front bulb thereby eliminating deposition of lead on the wiring conductors and their external terminals due to electrolysis.

BRIEF DESCRIPTION OF THE DRAWINGS

FIG. 4 is a sectional view thereof;

DETAILED DESCRIPTION OF THE PREFERRED EMBODIMENTS

Figure 1:
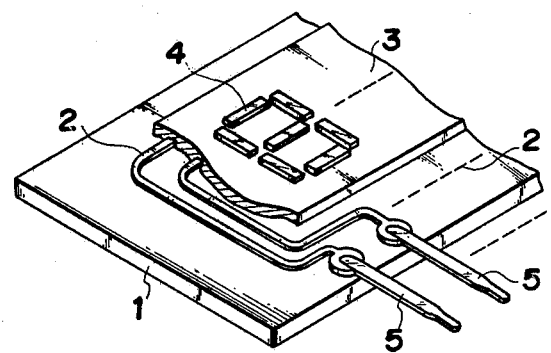
FIG. 1 is a partially cutaway perspective view of the substrate and its vicinity of a conventional fluorescent display tube formed by the use of the thick-film circuit technique.
Figure 2:
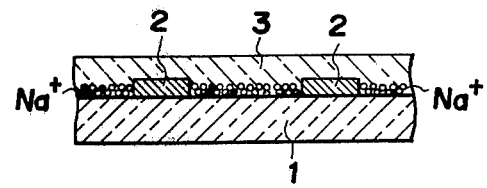
FIG. 2 is a sectional view thereof.
Figure 3:
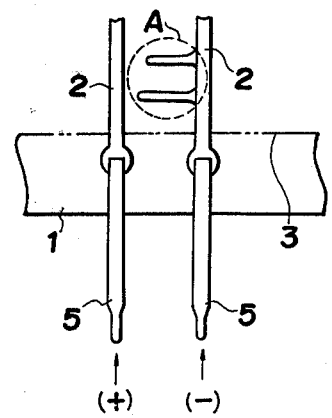
FIG. 3 is a drawing of assistance in explaining the problems of the conventional fluorescent diaplay tube.

Now, a preferred embodiment of the present invention will be hereinafter described with reference to FIGS. 4 and 5.

Reference numeral 11 designates a substrate formed by cutting sheet glass into a predetermined shape. The sheet glass is, for instance, soda-lime glass containing alkali metal oxides such as $Na_2O$. Reference numeral 12 designates a first crossover made of non-alkali type frit glass and formed at least on the portions of the substrate 11 where provision of the multilayer structure is required. The material of the first crossover 12 is printed on the substrate 11 by screen printing or the like so that the thickness thereof reaches about 10 to 50 $\mu$m, being then fired at about 550° C.

Non-alkali type glass, of which the crossover 12 is made, contains no alkali metal as its main component, except small amounts of alkali metals contained in the components thereof as impurities. Used as the above-mentioned non-alkali type glass is, for instance, frit glass composed of 50-60% PbO, 10-20% $B_2O_3$, 10-20% $SiO_2$ and in addition $Al_2O_3$, ZnO, etc., and having a softening temperature lower than that of the substrate 11 and a coefficient of thermal expansion similar to that of the substrate 11. This frit glass is mixed with binder and flux to form a paste-like mixture, which is then printed and fired on the substrate 11.

Reference numeral 13 designates wiring conductors formed on the first crossover 12 according to a predetermined circuit pattern. Reference numeral 14 designates a second crossover made of, e.g., glass having the same composition as the insulating material from which the first crossover 12 is formed. The second crossover 14 is formed on the first crossover 12 so that it covers the wiring conductors 13.

Figure 4:
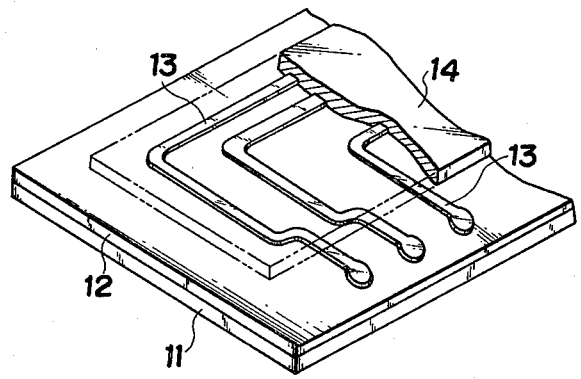
FIG. 4 is a partially cutaway perspective view of the substrate and its vicinity of the thick-film circuit device according to a preferred embodiment of the present invention.
Figure 5:
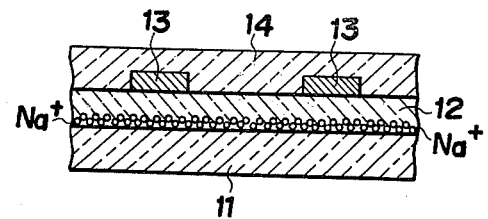

According to the above-mentioned preferred embodiment shown in FIGS. 4 and 5, when sodium ions Na+ are dispersed from within the substrate 11 and penetrated into the first crossover 12 through the interface between the substrate 11 and the first crossover 12 as shown in FIG. 5, the depth of penetration of sodium ions Na+ into the first crossover 12 is considered to be about 10 $\mu$m at the greatest. Therefore, if the first crossover 12 is made to be 10 $\mu$m or more thick, preferebly 20 $\mu$m or more thick, the movement of sodium ions Na+ toward the wiring conductors 13 can be prevented. As a result, even when a potential difference is given between any wiring conductors 13, electrolysis of sodium ions Na+ does not occur and thereby deposition of lead is prevented in the second crossover 14.

Now, another preferred embodiment of the present invention will be described in conjunction with FIGS. 6 and 7.

Reference numeral 11 designates a substrate 11 similar to that mentioned in the first embodiment. A first crossover 12 is formed, by printing and firing, at least on the portions of the substrate 11 where wiring conductors 13 and their external terminals 15 are formed. Also, a front-bulbside insulating layer 17 made of the same material as the first crossover 12 is previously provided at least at the bonding section of a front bulb 16 through which the external terminals 15 are penetrated. Then, the substrate 11 is bonded to the front bulb 16 by using a sealing cement 18, as frit glass, to form a package 19.

Thus, sodium ions Na+ dispersed from the substrate 11 or the front bulb 16 into the bonding section are prevented from moving by the crossover 12 and the insulating layer 17, and thereby the deterioration of insulation between the external terminals 15 are prevented.

In other words, the deposition of lead is completely prevented, which is caused by electrolysis associated with sodium ions Na+ moving from the substrate 11 or the front bulb 16. As a result, the device of the present invention can ensure sufficient insulation between the wiring conductors 13 or between the external terminals 15 even when kept at a high temperature for a long time, and therefore can maintain normal and stable circuit operations and can achieve a very long life.

Figure 6:
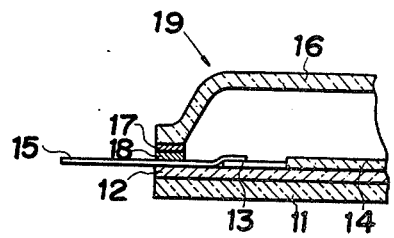
FIG. 6 is a sectional view of the essential part of the thick-film circuit device according to another preferred embodiment of the present invention.
Figure 7:
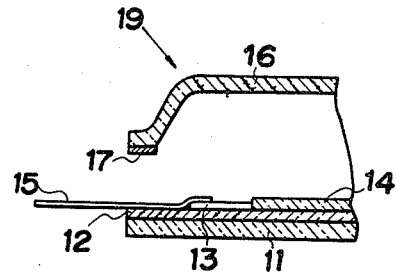
FIG. 7 is an exploded view thereof.

In the example shown in FIGS. 6 and 7, the external terminals 15 are formed from metal leads. However, they may be formed integrally with the wiring conductors 13 by printing as a matter of course.

Obviously many modifications and variations of the present invention are possible in the light of the above teachings. It is therefore to be understood that within the scope of the appended claims the invention may be practiced otherwise than as specifically described.

What is claimed as new and desired to be secured by Letters Patent of the United States is:

1. A thick-film circuit device comprising a substrate of insulating material such as sheet glass containing alkali components, a first crossover made of non-alkali type glass and formed on said substrate, wiring conductors formed on said first crossover according to a predetermined circuit pattern, and a second crossover made of glass and formed on said first crossover so that it covers said wiring conductors.

2. The thick-film circuit device as set forth in claim 1, wherein said wiring conductors are connected to external terminals, respectively.

3. A thick-film circuit device comprising a substrate of insulating material such as sheet glass containing alkali components, a front bulb made of insulating material such as glass containing alkali components, said front bulb being airtightly bonded to said substrate along its periphery by using a sealing cement to form a package, a first crossover made of non-alkali type glass and provided on said substrate in said package, wiring conductors and their external terminals formed on said first crossover according to a predetermined circuit pattern, said external terminals being airtightly penetrated through the bonding section of said package, a front-bulb-side insulating layer made of the same material as said first crossover and provided at least at the portions of the bonding section of said front bulb where said external terminals penetrate, and a second crossover made of glass and provided on said first crossover so that it covers said wiring conductors and their external terminals.

4. The thick-film circuit device as set forth in claim 2 or 3, wherein said external terminals are formed integrally with said wiring conductors on said first crossover by printing, respectively.

5. The thick-film circuit device as set forth in claim 2 or 3, wherein said external terminals are formed from metal leads.

6. The thick-film circuit device as set forth in claim 1, 2, or 3, further comprising phosphor-coated anodes electrically connected to the corresponding wiring conductors through through-holes provided in said second crossover, a filamentary cathode for emitting thermions when heated, and said anodes being adapted to visually display numerals, characters, graphic symbols and the like when bombarded with said thermions.

* * * * *